United States Patent

Porter

[15] 3,657,030

[45] Apr. 18, 1972

[54] TECHNIQUE FOR MASKING SILICON NITRIDE DURING PHOSPHORIC ACID ETCHING

[72] Inventor: Roy Arlie Porter, Whitehall, Pa.

[73] Assignee: Bell Telephone Laboratories, Incorporated, Murray Hill, N.J.

[22] Filed: July 31, 1970

[21] Appl. No.: 59,979

[52] U.S. Cl. ................................156/13, 117/106, 117/119, 117/215, 148/186, 156/17

[51] Int. Cl. ........................................................H01l 7/50

[58] Field of Search .......................156/13, 17; 317/235, 234; 148/187, 174, 186, 175, 180, 188, 189; 117/215, 106, 119; 96/36.2, 44

[56] References Cited

UNITED STATES PATENTS 3,334,281 8/1967 Ditrick...................................317/235

3,537,921 11/1970 Boland.................................156/17 X

*Primary Examiner*—William A. Powell
*Attorney*—R. J. Guenther and Edwin B. Cave

[57] ABSTRACT

A technique for passivating silicon nitride to phosphoric acid etchants during the formation of semiconductor devices is disclosed. The technique consists of exposing a silicon nitride surface to a diffusion source consisting of either a boron or phosphorous containing source material. The silicon nitride surface is exposed to the diffusion source, at a temperature ranging from 750–1,140° C, for a period of time sufficient to form a diffused source-rich layer of silicon nitride having the desired depth. The source-rich film is then oxidized in a wet oxygen or steam ambient, at a temperature ranging from 850–1,100° C, for a period of time sufficient to form a passivating film. The passivating film is immune from attack by phosphoric acid but can be etched with hydrofluoric acid.

5 Claims, 9 Drawing Figures

FIG. D

INVENTOR
R. A. PORTER
BY
ATTORNEY

TECHNIQUE FOR MASKING SILICON NITRIDE DURING PHOSPHORIC ACID ETCHING

BACKGROUND OF THE INVENTION

1. Field of the Invention

This invention relates to a technique for masking silicon nitride during phosphoric acid etching, and, more particularly, to a technique for masking silicon nitride to phosphoric acid etchants during the formation of semiconductor devices.

2. Description of the Prior Art

The use of dielectric coatings as a mask material in diffusion and deposition procedures and as protective coatings for devices is well known. These techniques are particularly well developed for the fabrication of planar and field effect semiconductor devices of various types. For quite some time silicon oxide has been widely used as a dielectric coating on a variety of semiconductor substrates. Silicon oxide is particularly advantageous for this purpose because it is etched by hydrofluoric acid which does not attack the standard organic photoresist materials used to define etch patterns on a dielectric coating.

Recently, silicon nitride has become of considerable interest for use in place of silicon oxide. However, silicon nitride is not susceptible to substantial etching by hydrofluoric acid in the manner of silicon oxide. Silicon nitride on the other hand is readily etched by hot phosphoric acid. However, the hot phosphoric acid also attacks the usual organic photoresist coatings used to define the etch patterns thereby presenting a problem concerning the use of silicon nitride dielectrics.

To enable the use of silicon nitride in the manufacture of semiconductor devices and to obviate the above problem concerning the use of phosphoric acid with the usual organic photoresist coatings, silicon oxide has been used in the prior art as an overlayer of the silicon nitride. A photoresist etch mask is then produced on top of the silicon oxide layer to define the desired dielectric pattern, whereupon the exposed silicon oxide is etched with hydrofluoric acid exposing the underlying silicon nitride layer. Finally this underlying silicon nitride layer is etched with hot phosphoric acid while the portions covered by the silicon oxide layer or mask are immune from attack. However, it has been found that the silicon oxide mask deposited on the silicon nitride forms many pinholes which lead to the development of pinholes in the silicon nitride underlayer during the hot phosphoric acid etching. A technique whereby these pinholes could be eliminated in the silicon nitride layer is therefore desirable in the production of silicon nitride dielectric semiconductor devices.

SUMMARY OF THE INVENTION

The present invention is directed to a method of masking or passivating regions of a silicon nitride layer to hot phosphoric acid during the production of semiconductor devices. The technique is one which optimizes the masking, i.e., prevents pinhole formation, by employing the nitride itself, which is virtually pinhole free. Briefly, the inventive technique consists of exposing a clean silicon nitride surface to a diffusion source comprising a boron or a phosphorous containing species for a period of time sufficient to form either a diffused boron-rich layer or a diffused phosphorous-rich layer of silicon nitride, respectively. The resultant diffused layer is then steam oxidized for a period of time sufficient to form a passivating film or a mask of passivated material which is immune to attack by hot phosphoric acid but which can be etched with hydrofluoric acid in a manner comparable to that of silicon oxide.

BRIEF DESCRIPTION OF THE DRAWING

The invention will be more readily understood from the following detailed description taken in conjunction with the drawing in which:

FIGS. 1A to 1F show in partial cross section successive steps in the masked etching method in accordance with this invention;

DETAILED DESCRIPTION

Figure 1A:
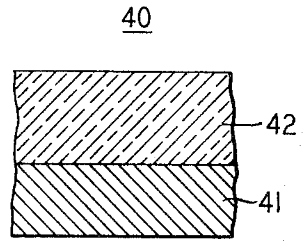

Referring to FIGS. 1A to 1F, there are shown successive steps in the formation of a semiconductor device including the phosphoric acid masking or passivating technique of the invention. Referring to FIG. 1A, the body 40 comprises a semiconductor substrate 41, e.g., a single crystal silicon slice which may include a layer formed by epitaxial deposition. Deposited on substrate 41 by deposition techniques well known in the art is a first layer 42 of silicon nitride which is capable of being etched with phosphoric acid. Typically, silicon nitride coatings are formed by a process in which silane ($SiH_4$) and ammonia ($NH_3$) are mixed in a carrier gas stream of hydrogen and introduced into a chamber containing the substrate body at a temperature ranging from 850°–900° C. The resultant reaction involves the decomposition of the silane and the synthesis of silicon nitride which is deposited on the substrate surface. In an alternative method a low temperature plasma reaction of the type described in U.S. Pat. No. 3,287,243, granted to J. R. Ligenza on Nov. 22, 1966, may be used. Typically, a silicon nitride layer having a thickness of about 2,500 –3,500 A is produced. It should be noted here that where a silicon semiconductor substrate is employed, it has been found that the silicon nitride is advantageously deposited on a silicon oxide layer formed on the silicon substrate, otherwise an hypothesized $\alpha$ type silicon nitride may be formed which is more difficult to etch with phosphoric acid.

The silicon nitride layer 42 is next exposed to a diffusion source comprising boron or phosphorous which will not chemically attack silicon nitride layer 42, e.g., $PBr_3$, $P_2O_5$, $B_2O_3$, $BBr_3$, $BCl_3$ and BN. Layer 42 is exposed to the diffusion source for a sufficient period of time to form a diffused source-rich silicon nitride second layer 43 (FIG. 1B); i.e., either a boron-rich silicon nitride layer or a phosphorous-rich silicon nitride layer is formed, depending of course on the diffusion source employed. FIG. 2 is a schematic representation of a typical apparatus employed in conducting a gaseous-solid diffusion step. Shown in the figure is a furnace 44, having inserted therein a quartz tube 46. The substrate 41 with the silicon nitride layer 42 thereon is contained within a quartz boat 47, which in turn is housed in tube 46.

In operation, a carrier gas, e.g., nitrogen, is passed through an inlet tube 48 into a container 49 containing a liquid diffusion source, e.g., $PBr_3$ or $BBr_3$. Affixed at the end of the inlet tube 48 contained within container 49 and immersed in the liquid 51 is a bubbler 52. The container 49 is immersed in a bath 53 which maintains the liquid 51 at a fixed temperature.

The carrier gas, e.g., nitrogen, passes through the bubbler 52 through the liquid 51, whereby the carrier gas becomes saturated with the liquid 51, e.g., $BBr_3$, at the temperature at which the bath 53 is maintained. Typically, the bath 53 is maintained at a temperature which will give a concentration of the boron or phosphorous containing species, e.g., $BBr_3$ or $PBr_3$, in the carrier gas of from 500 to 2,000 p.p.m. This temperature can be determined from the standard vapor pressure data of the source species selected. The source species-saturated gas then passes through inlet tube 54 into the quartz tube 46 maintained within the furnace 44.

The temperature of the furnace is maintained from 750°–1,140° C and the carrier gas with the source species contained therein is passed through tube 46 into contact with layer 42 for a period of time sufficient to form via a diffusion mechanism, the desired depth of the source-rich silicon nitride layer 43. It is understood that the depth of layer 43 is dependent upon the source species concentration, the temperature employed, the time of exposure, and of course, on the diffusion constant of the boron or the phosphorous in the silicon nitride layer 42. It has been found that the minimum depth required for the passivation of the silicon nitride to phosphoric acid etching has been 100 A., i.e., a diffused source-rich layer, rich in either phosphorous or boron should have sufficient depth to give a 100 A. passivated layer (56, FIG. 1C). It is to be noted here that it has been found advantageous at times to add a small trace of oxygen or water vapor in the carrier gas when $BBr_3$, $BCl_3$ or $PBr_3$ is used.

Figures 3, 4:
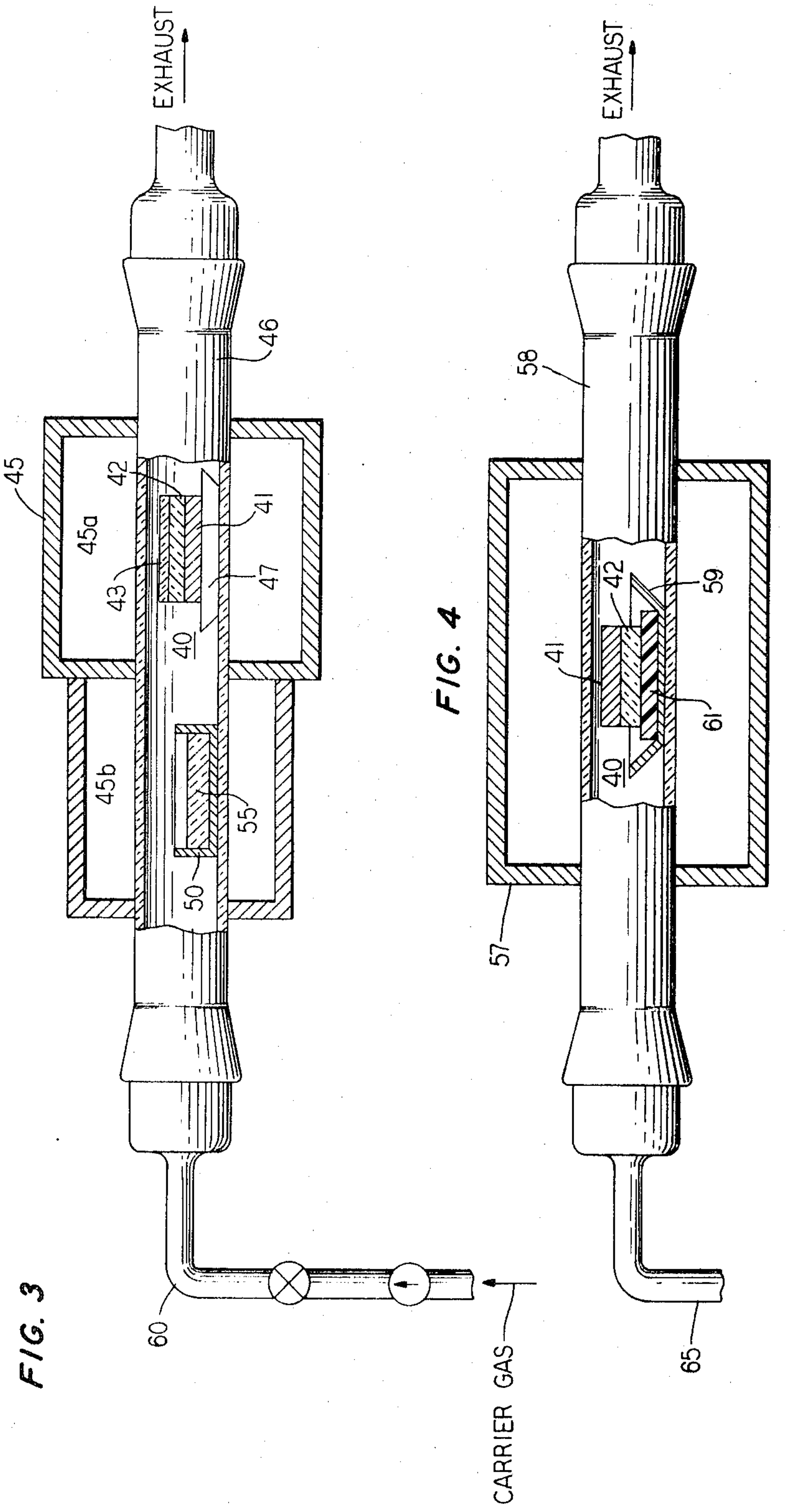
FIG. 3 is a cross-sectional view of a second typical gaseous-solid diffusion apparatus.
FIG. 4 is a cross-sectional view of a typical solid-solid diffusion apparatus.

A second typical gaseous-solid diffusion apparatus is shown in FIG. 3. Shown in FIG. 3 is a furnace 45 which has two temperature zones 45a and 45b. The quartz tube 46 is inserted through both zones, 45a, and 45b, of the furnace 45. The substrate 41 with the silicon nitride layer 42 thereon is contained within the quartz boat 47, which in turn is housed within the higher temperature zone 45a of the furnace 45. Placed within the low temperature zone 45b is a quartz vessel 50 destined to hold a solid diffusion source 55, e.g., $B_2O_3$, BN or $P_2O_5$. Affixed to one end of tube 46 is an inlet tube 60 through which a carrier gas, e.g., nitrogen, is passed into and through tube 46.

In operation, the carrier gas, e.g., nitrogen, is passed through inlet 60 into tube 46. Zone 45b is maintained at a temperature sufficient to give the desired concentration of the source species, e.g., $B_2O_3$, $P_2O_5$, or BN, in the carrier gas. This concentration is typically in the range of 500 to 2,000 parts per million. The temperature is determined by the partial pressure of the species selected. The carrier gas, containing the source species in the concentration desired, then passes into zone 45a which houses substrate 41 with its silicon nitride layer 42.

The temperature of zone 45a is maintained from 750°–1,140° C and the carrier gas with the source species contained therein is passed through tube 46 into contact with layer 42, maintained within zone 45a, for a period of time sufficient to form the desired depth of the source-rich silicon nitride layer 43.

Figure 1B:
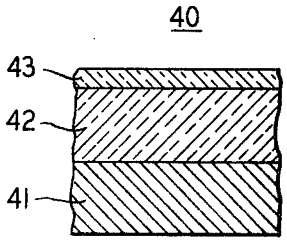
Figure 2:
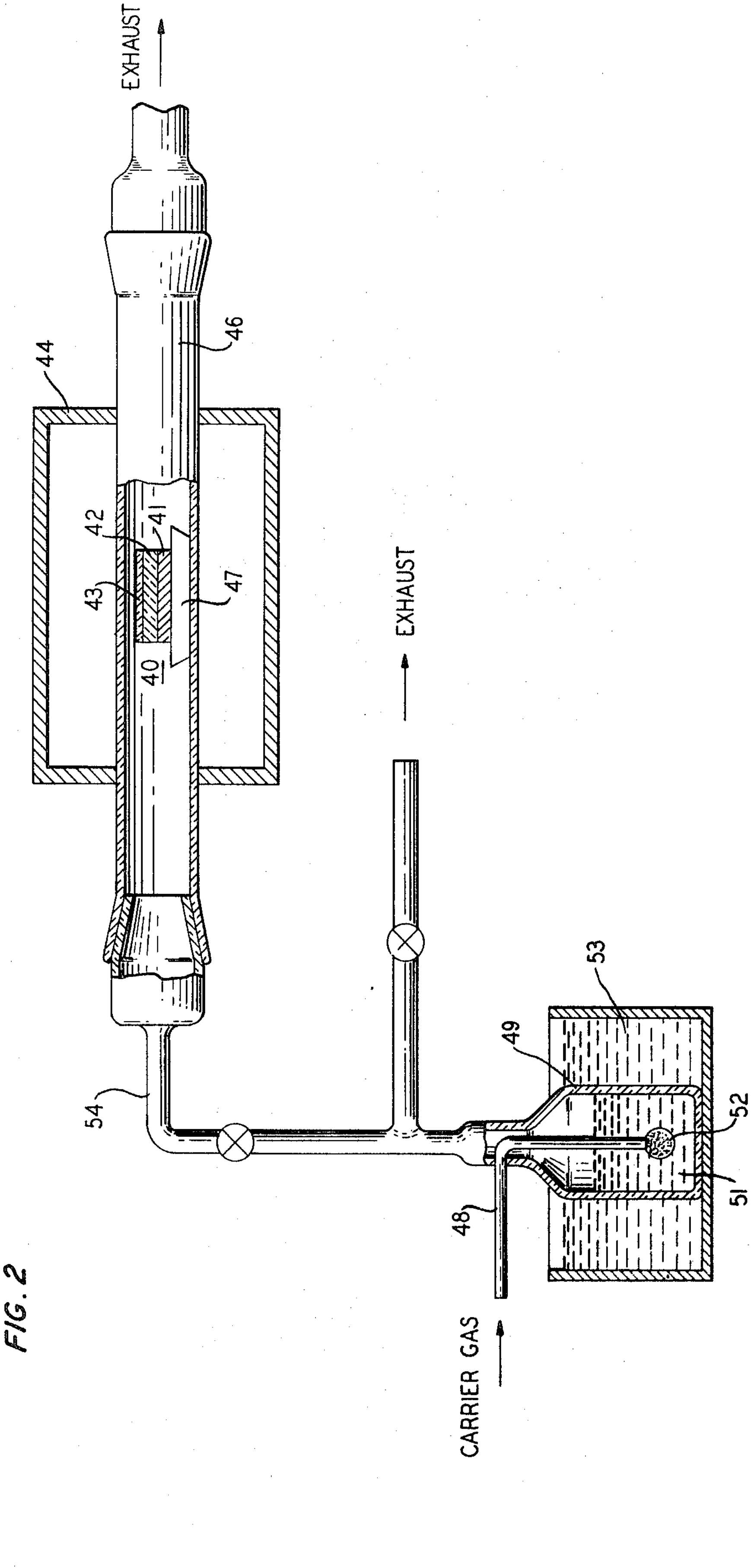
FIG. 2 is a cross-sectional view of a typical gaseous-solid diffusion apparatus.

IF A solid-solid source diffusion is contemplated, as in the case where solid boron or phosphorous containing species are employed as the diffusion source material, e.g., BN, $B_2O_3$, or $P_2O_5$, apparatus similar to that shown in FIG. 4 may be employed to obtain a source-rich silicon nitride layer 43 (FIG. 1B). Shown in FIG. 4 is a furnace 57, having inserted therein a quartz tube 58. The substrate 41 with its silicon nitride layer 42 is contained within a quartz boat 59 housed in tube 58, layer 42 being in intimate contact with a crystalline boron or phosphorous containing species 61, e.g., BN, $B_2O_3$, or $P_2O_5$. An inert or oxidizing ambient is passed through an inlet tube 65 into and through tube 58. The furnace 57 is then heated to a temperature in the range of 750°–1,140° C for a period of time sufficient to build up the desired depth of the source-rich silicon nitride layer 43 (FIG. 1B), which may be either a boron-rich silicon nitride layer or a phosphorous-rich silicon nitride layer. The time of reaction or rather diffusion may range from a minimum of 1 minute to a maximum determined by the depth of layer 43 desired. In this regard it is again understood that the depth of layer 43 is dependent upon those factors mentioned previously. Also it is to be understood that a standard vapor phase deposition apparatus may be employed whereby an adherent diffusion source coating is deposited on layer 42 and solid-solid diffusion carried out.

It is of course obvious that the apparatus (FIGS. 2, 3 and 4) and procedures described above for the source diffusion, from both the gaseous and solid phase, into the silicon nitride surface is for illustrative purposes only and any standard diffusion apparatus and techniques known in the art may be employed equally as well.

Figure 1C:
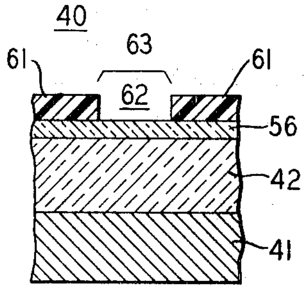
Figure 1C:
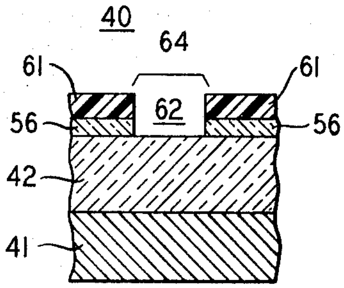

When the requisite depth of layer 43 (FIG. 1B) is attained, the body 40 consisting of the substrate 41, the silicon nitride layer 42 and the diffused layer 43 is removed from contact with the diffusion source and is then immediately passed into a standard steam or wet oxygen furnace. In this regard, it is to be noted that the substrate 41 with layers 42 and 43 may be allowed to cool, prior to insertion into the steam furnace. The steam furnace containing wet oxygen, i.e., oxygen having water vapor therein, is maintained at a temperature in the range of 850°–1,100° C, and the substrate 41 with layers 42, 43 is maintained therein for a period of at least 60 minutes whereby the diffused source-rich layer 43, i.e., either a boron- or phosphorous-rich silicon nitride layer, is oxidized to a passivating film or layer 56 (FIG. 1C). In other words, the diffused source-rich layer 43 has been converted into a film passivated from attack by phosphoric acid. Layer 56 has been hypothesized to be a silicon oxynitride species which is immune to attack by phosphoric acid but which has good photoresist adhesion and can be etched by hydrofluoric acid in a manner similar to that of silicon oxide.

Referring to FIG. 1C, after the passivated layer 56 is obtained, a photoresist mask 61 is provided in accordance with standard techniques well known in the art. The photoresist mask 61 is shown in developed form, whereby a portion thereof is removed so as to form an opening 62 in mask 61, thereby exposing the underlying portion 63 of passivated film 56. It is of course understood that although only one opening has been illustrated, the invention is not to be restricted thereby and a plurality of openings and patterns may be employed.

Referring to FIG. 1D, body 40 is treated in a solution of buffered hydrofluoric acid so as to selectively remove the unmasked portion 63 of the phosphoric acid passivated layer 56 (FIG. 1C). The opening or window 62 is thus extended to a portion 64 of the surface of the silicon nitride layer 42. Inasmuch as the hydrofluoric acid solution does not substantially attack silicon nitride, the etching treatment terminates upon the complete removal of the unmasked region 63 (FIG. 1C).

Figure 1E:
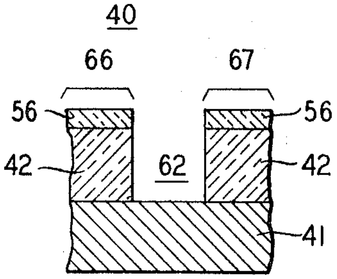
Figure 1F:
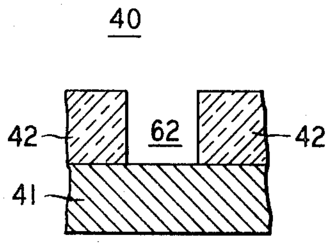

Referring to FIG. 1E, the etched pattern is completed by treating the body 40 with a solution of hot phosphoric acid, typically maintained at a temperature in the range of 140°–180° C. The phosphoric acid attacks the dielectric pattern or mask 61, and the exposed silicon nitride region 64 (FIG. 1D) of layer 42 but does not attack the portions 66 and 67 of the silicon nitride layer 42 masked by the passivated layer or mask of passivated material 56. Finally, referring to FIG. 1F, the passivated film or mask 56 may be removed by treatment with a buffered solution of hydrofluoric acid which does not significantly etch the silicon nitride layer 42. It is, of course, obvious that if a silicon oxide underlayer is interposed between semiconductor surface and the silicon nitride layer, as in the case of silicon, the silicon oxide layer is also removed by the hydrofluoric acid.

Specific examples for the passivating of silicon nitride to phosphoric acid during the formation of semiconductor devices are as follows:

EXAMPLE 1

A 2,500 A. thick silicon nitride film was deposited upon a single crystal silicon wafer having thereon a silicon oxide layer. The wafer was then inserted in a standard diffusion apparatus similar to that described in FIG. 2. The wafer was then exposed, at a temperature of 850° C for 15 minutes, to a nitrogen gas ambient mixture containing 2 percent by volume oxygen and 2,000 parts per million $BBr_3$. The gas mixture was passed through the apparatus at a rate of 2 $cm^3$/min. The boron diffusion source was discontinued and the wafer was maintained in the furnace at 850° C for an additional 45 minutes. The wafer with its resultant boron-rich silicon nitride layer was removed from the diffusion apparatus and oxidized in a steam ambient maintained at a pressure of one atmosphere and a temperature of 850° C for 60 minutes resulting in the formation of an 800 A. thick phosphoric acid passivated film. Upon removal from the steam ambient, a photoresist pattern was spun on the passivated film surface and window cutting processes were performed as described above.

EXAMPLE 2

A 2,500 A. thick silicon nitride film was deposited upon a single crystal silicon wafer having thereon a silicon oxide layer. The wafer was then inserted in a standard solid-solid phase diffusion apparatus similar to that described in FIG. 4. The wafer was then exposed, at 850° C for 15 minutes, to a BN source under a nitrogen gas ambient mixture containing 2-volume percent oxygen. The wafer with its resultant boron-rich silicon nitride layer was removed from the diffusion apparatus and oxidized in a steam ambient maintained at a pressure of one atmosphere and a temperature of 900° C for 60 minutes resulting in the formation of a 100 A. thick mask of passivated material immune to hot phosphoric acid etching at 140° C. Upon removal from the steam ambient, a photoresist pattern was spun on the passivated film surface and window cutting processes were performed as described above.

EXAMPLE 3

A 2,500 A. thick silicon nitride film was deposited upon a single crystal silicon wafer having thereon a silicon oxide layer. The wafer was then inserted in a standard gaseous diffusion apparatus similar to that described in FIG. 2. The wafer was then exposed at 1,000° C for 60 minutes to a nitrogen gas ambient mixture containing 2 percent by volume oxygen and 700 parts/million $PBr_3$. The wafer with its resultant phosphorous-rich silicon nitride layer was removed from the diffusion apparatus and oxidized in a steam ambient maintained at one atmosphere of pressure and at a temperature of 900° C for 60 minutes resulting in the formation of a 100 A. thick mask of passivated material immune to phosphoric acid etching at 140° C. Upon removal from the steam ambient a photoresist pattern was spun on the passivated film surface and window cutting processes were performed as described above.

EXAMPLE 4

A 2,500 A. thick silicon nitride film was deposited upon a single crystal silicon wafer having thereon a silicon oxide layer. The wafer was then inserted in a standard gaseous diffusion apparatus similar to that described in FIG. 2. The wafer was then exposed, at 1,040° C for 60 minutes, to a nitrogen gas ambient mixture containing 2 percent by volume oxygen and 100 parts/million $PBr_3$. The wafer with its resultant phosphorous-rich silicon nitride layer was removed from the diffusion apparatus and oxidized in a steam ambient maintained at a pressure of one atmosphere for 60 minutes resulting in the formation of a 300 A. thick phosphoric acid passivated film. Upon removal from the steam ambient a photoresist pattern was spun on the passivated film surface and window cutting processes were performed as described above.

What is claimed is:

1. The method of producing a silicon nitride layer on the surface of a semiconductor body in a desired pattern which comprises:

a. forming on the semiconductor surface a first layer of silicon nitride which is capable of being etched with phosphoric acid;

b. treating said silicon nitride first layer with a diffusion source selected from the group consisting of boron and phosphorous containing species, to form a diffusion source-rich silicon nitride second layer;

c. oxidizing said source-rich second layer in a steam ambient to form a passivating film inert to phosphoric acid;

d. forming on said passivating film a photoresist layer;

e. selectively removing portions of said photoresist to form the pattern and to expose surface portions of said passivating film;

f. applying a solution of hydrofluoric acid to said exposed portions of passivating film to form the desired pattern in the passivating film by selective removal of portions of said passivating film, thereby exposing surface portions of said first layer; and g. applying a solution of phosphoric acid to said portions of said first layer to define the desired pattern in said first layer by selective removal of portions of said first layer.

2. The method as defined in claim 1 wherein said silicon nitride first layer is exposed to said diffusion source in the temperature range of 750°–1,140° C.

3. The method as defined in claim 1 wherein said resultant source-rich layer is oxidized in said steam ambient at a temperature in the range of 850°–1,100° C.

4. The method as defined in claim 3 wherein said resultant source-rich layer is maintained in said steam ambient for a time period of at least 60 minutes.

5. The method as defined in claim 3 wherein said semiconductor body is silicon.

* * * * *